United States Patent [19]

Turolla et al.

[11] Patent Number: 4,646,037
[45] Date of Patent: Feb. 24, 1987

[54] FILTER CONTACT AND ITS USE IN ELECTRIC CONNECTORS

[75] Inventors: Jean-Pierre Turolla, Issy les Moulineaux; Simone Belin, Talant, both of France

[73] Assignee: LCC-CICE Compagnie Europeenne de Composants Electroniques, Courbevoie, France

[21] Appl. No.: 736,844

[22] Filed: May 22, 1985

[30] Foreign Application Priority Data

May 25, 1984 [FR] France ............................. 84 08251

[51] Int. Cl.$^4$ ......................... H03H 7/01; H02H 9/04
[52] U.S. Cl. ..................................... 333/182; 333/12; 333/17 L; 333/185; 361/119
[58] Field of Search ..................... 333/12, 17 R, 17 L, 333/81 R, 81 A, 167, 181–185; 338/21; 361/110, 111, 113, 117–119, 126–127; 339/111, 147 R, 147 C, 143 C

[56] References Cited

U.S. PATENT DOCUMENTS 3,002,162 9/1961 Garstang ...................... 333/183 X
3,435,387 3/1969 Reinke et al. ..................... 333/183
3,711,794 1/1973 Tasca et al. ......................... 333/243
3,840,841 10/1974 Clark ................................ 333/182 X

OTHER PUBLICATIONS

Machine Design, vol. 52, No. 7, Apr. 1980, pp. 135–136, Cleveland, Ohio U.S.; P. Dobrogowski: "Filtering EMI with Connectors".

Primary Examiner—Marvin L. Nussbaum
Attorney, Agent, or Firm—Oblon, Fisher, Spivak, McClelland, & Maier

[57] ABSTRACT

A filter contact comprising an electric contact in the form of a metal rod surrounded by a filter element of tubular shape. The external face of the filter element is fitted with a first electrode and the internal face of the filter element is fitted with a second electrode which is connected to the electric contact, the two electrodes being isolated from each other. The filter element of tubular shape is constituted by a tubular varistor in which the second electrode has an extension on at least one lateral electrode face having a zone of rounded shape such that coating in this zone with an electrode paste known per se produces a deposit of substantially constant thickness.

4 Claims, 2 Drawing Figures

U.S. Patent   Feb. 24, 1987   4,646,037
FIG_1
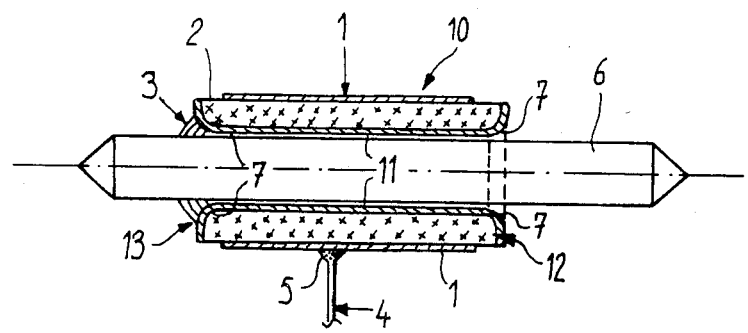
FIG_2
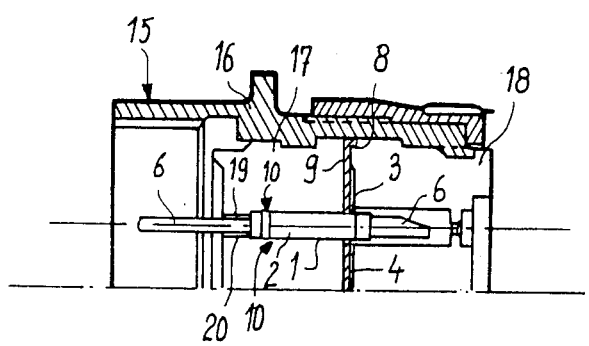

FILTER CONTACT AND ITS USE IN ELECTRIC CONNECTORS

BACKGROUND OF THE INVENTION

1. Field of the Invention

The present invention relates to a filter contact comprising an electric contact in the form of a metal rod surrounded by a filter element of tubular shape which is fitted with a first electrode on its external face and with a second electrode on its internal face, said second electrode being electrically connected to the electric contact, the two electrodes being insulated from each other.

2. Description of the Prior Art

Filter contacts are particularly useful in electric connectors. A filter contact of this type is described in French Pat. No 2,185,879. The filter contacts described in this patent application are particularly intended for attenuation of high-frequency waves. The filter employed in this application consists of a tubular element of ceramic material in which is housed a tubular element of ferrite. There is thus obtained an LC filter having a cutoff frequency which depends on the value of these elements.

Although filter elements of this type permit suppression of HF waves which are liable to modulate an analog signal transmitted by the electric contact, they are usually ill-suited to protection of digital signals against spurious pulses which originate from various sources and exhibit high overvoltage in a random manner. Spurious pulses of this type are liable to modify the contents of the message transmitted in digital form, which is in turn liable to produce errors in the received signal.

SUMMARY OF THE INVENTION

The present invention makes it possible to avoid these disadvantages. With this objective, the filter contact in accordance with the invention is distinguished by the fact that the filter element of tubular shape is constituted by a tubular varistor in which the second electrode has an extension on at least one lateral electrode face having a zone of rounded shape such that coating in said zone with an electrode paste known per se produces a deposit of substantially constant thickness.

In a preferential embodiment, the distinctive feature of the filter contact in accordance with the invention lies in the fact that the second electrode is electrically connected to the contact by means of a brazed joint formed in the zone of rounded shape of the lateral face of the varistor.

In its application to electric connectors, the first electrode which forms part of a filter contact of this type and is placed on the external face of the varistor is connected to the metal shroud of the connector and/or to ground.

BRIEF DESCRIPTION OF THE DRAWINGS

Other features of the invention will be more apparent to those skilled in the art upon consideration of the following description and accompanying drawings, wherein:

FIG. 1 is a sectional view of a filter contact in accordance with the invention;

FIG. 2 is a part-sectional view of a cylindrical electric connector provided with a filter contact in accordance with the invention.

DESCRIPTION OF THE PREFERRED EMBODIMENT

FIG. 1 is a sectional view of a filter contact in accordance with the invention. This filter contact is essentially composed of an electric contact 6 and of a varistor 10. Said varistor is of tubular shape and surrounds the electric contact 6. Said varistor 10 comprises a body 2 having a non-linear resistance with a voltage threshold $V_O$. Said tubular body 2 is surrounded externally by a cylindrical electrode 1 and lined internally with an electrode 11 which is also cylindrical. The inner electrode 11 is provided with an extension on the lateral faces of the tubular varistor and completely covers said lateral faces in the example illustrated in the figure. Said inner electrode 11 has a rounded portion 7 which follows the substantially identical rounded shape of the lateral faces of the body 2 of the varistor 10.

In accordance with an alternative embodiment which is not shown in the figure, said inner electrode 11 can be continued on the external face of the tube forming the varistor 10. As will be readily apparent, the electrodes 1 and 11 will be disposed on said external face at a sufficient distance to guard against any potential danger of breakdown between the electrodes. The lateral face 13 of the varistor 10 is brazed onto the electric contact 6. The brazed joint 3 has the double function of establishing an electrical contact and providing a mechanical support between the varistor and the electric contact 6. As can readily be understood, it is also possible to form a brazed joint 3 on the lateral face 12 of the varistor 10. In practice, the outer electrode 1 of the varistor is connected to a ground plane 4 by means of a brazed joint 5.

By way of example, the varistor element proper which constitutes the body 2 of said varistor 10 can be constructed in accordance with the indications given in French Pat. Nos. 2,363,171 or 2,475,791. In particular, French Pat. No. 2,475,791 specifies the thickness to be given to the varistor according to the threshold voltage $V_O$ at which it is desired that a transition of said element should take place. In practice, said varistor element 10 will be fabricated from a composition having a base of zinc oxide ZnO which is well-known to those versed in the art. The method for fabricating tubular varistors consists in extruding a paste having a predetermined composition on a mandrel in order to obtain a hollow tube which is dried, cut after drying into elements of predetermined length, then sintered at a suitable temperature. After sintering, the electrodes are deposited on this tubular element in the form of a silver-base paste of the type used for silk-screen printing. Taking into account the tubular shape of these varistors, deposition of the inner electrode must be performed with care. In fact, if said inner electrode 11 is to be soldered to the contact 6 both easily and with a good electrical contact, it is necessary to ensure that said electrode projects either partially or completely from at least one of the lateral faces 12, 13 of the tubular varistor 10. With this object in view, it has been found necessary to round-off the internal edges of the varistor in order to suppress any sharp edge or areas at the level of the transition between the internal face of the varistor body 2 and the lateral faces 12 and 13. The exact shape of the rounded profile to be adopted is determined in practice by any one skilled in the art by simple routine handling operations as a function of the nature of the electrode paste employed as well as the composition of the varistor body 2. The shape of said internal rounded edge will be such that, at the time of deposition of the electrode paste by coating, the inner electrode 11 thus obtained has a substantially constant thickness between the internal portion of the varistor at least up to the end of the lateral face 12 and/or 13.

The part-sectional view of FIG. 2 illustrates a connector which makes use of a contact in accordance with the invention. Said connector 15 comprises a metal shroud 16 in which are housed an electric insulating unit 17 provided with an extension in the form of a flexible rubber bushing 18. The electric contact 6 fitted with its varistor 10 is introduced within the corresponding housing 19 of the insulating unit 17. The front portion 20 of said electric contact 6 is applied against a corresponding stop of the insulating unit 17. After introduction of the electric contacts 6 each fitted with their varistor 10, the complete assembly is covered by a metal plate 4 pierced with holes having a diameter which is substantially equal to the external diameter of the varistor 10 (subject to differences in allowance). Preforms 3 of solder are placed around each electric contact 6 and a preform 8 of solder is placed at the end of the metal plate 4. The preforms 3 and 8 respectively are melted by heating, thus connecting electrically and mechanically on the one hand the outer electrode 1 of each varistor 10 to the metal plate 4 and on the other hand said metal plate 4 to the metal shroud 16. Other modes of electrical contact between the outer electrode 1 of the filter element and the grounding means are described for example in U.S. Pat. Nos. 3,435,387, 3,569,915 and in French Pat. No. 2,141,962.

What is claimed is:

1. A filter contact comprising:
   an electric contact including a metal rod;
   a tubular filter element surrounding said rod, said tubular filter element having a major internal face defined by the length of said element and the inside radius of said tubular filter element and a major external face defined by the length of said element and the outside radius of said element;
   a first electrode provided on said external face;
   a second electrode provided on said internal face wherein said second electrode is electrically connected to said electric contact and wherein said second electrode is electrically insulated from said first electrode;
   wherein said tubular element includes a tubular varistor and wherein said second electrode includes at least one extended portion which substantially extends from near at least one end of said internal face so as to cover at least one end surface of said tubular varistor; and
   wherein said at least extended portion of said second electrode forms with said at least one end surface a rounded profile with each of said at least one extended portions having a substantially constant thickness.

2. A filter contact according to claim 1 wherein said second electrode is electrically connected to said contact by means of a brazed joint formed between said contact and said at least one extended portion of said second electrode.

3. A filter contact according to claim 1 wherein said second electrode further includes an external face portion which extends onto part of said external face of said varistor.

4. A filter contact according to claim 2 wherein said second electrode further includes an external face portion which extends onto part of said external face of said varistor.

* * * * *